United States Patent [19]

Hovel et al.

[11] Patent Number: 4,576,652
[45] Date of Patent: Mar. 18, 1986

[54] INCOHERENT LIGHT ANNEALING OF GALLIUM ARSENIDE SUBSTRATE

[75] Inventors: Harold J. Hovel, Katonah; Thomas F. Kuech, Ossining, both of N.Y.

[73] Assignee: International Business Machines Corporation, Armonk, N.Y.

[21] Appl. No.: 630,057

[22] Filed: Jul. 12, 1984

[51] Int. Cl.⁴ .......................................... H01L 21/263
[52] U.S. Cl. ................................. 148/1.5; 29/576 B; 148/187; 148/DIG. 4; 148/DIG. 84; 357/61; 427/53.1
[58] Field of Search ....................... 148/1.5, 175, 187; 29/576 B; 357/61; 427/53.1

[56] References Cited

U.S. PATENT DOCUMENTS

| | | | |
|---|---|---|---|
| 3,211,589 | 10/1965 | McCaldin | 148/1.5 |
| 3,393,103 | 7/1968 | Hellbardt et al. | 148/175 |
| 3,963,540 | 6/1976 | Camp, Jr. et al. | 148/20.3 |
| 3,984,263 | 10/1976 | Asao et al. | 148/175 |
| 4,002,505 | 1/1977 | Bult | 148/20.3 |
| 4,174,982 | 11/1979 | Immorlica, Jr. | 148/1.5 |
| 4,350,537 | 9/1982 | Young et al. | 148/1.5 |
| 4,473,939 | 10/1984 | Feng et al. | 29/571 |

FOREIGN PATENT DOCUMENTS 0155530 12/1981 Japan ................................. 29/576 T
2065973 7/1981 United Kingdom ............. 29/576 B

OTHER PUBLICATIONS

Kuzuhara et al, Appl. Phys. Letts. 41 (1982) 755; 54 (Jun. 1983) 3121.
Lee et al in Ion Implantation in Semiconductors 1976, Ed. Chernow et al, Plenum, N.Y., p. 115.
Shahid et al, Rad. Effects Letts. 86 (Mar. 1984) 87.
Williams, J. S. in Laser-Solid Interactions... Materials, Ed. Narayan et al, 1982, North-Holland, N.Y., p. 621.
English translation of Japanese documents 56-112735 and 55-158628.
"Proximate Capless Annealing of GaAs Using a Controlled-Excess As Vapor Pressure Source", J. M. Woodall, et al., Appl. Phys. Lett., vol. 38, No. 8, Apr. 15, 1981, pp. 639-641.

Primary Examiner—Upendra Roy
Attorney, Agent, or Firm—Pollock, Vande Sande & Priddy

[57] ABSTRACT

Ion implanted gallium arsenide substrates are annealed by providing an arsenic-containing gaseous ambient on all sides of the substrate, and heating the gallium arsenide substrate with broad area incoherent light.

19 Claims, 1 Drawing Figure

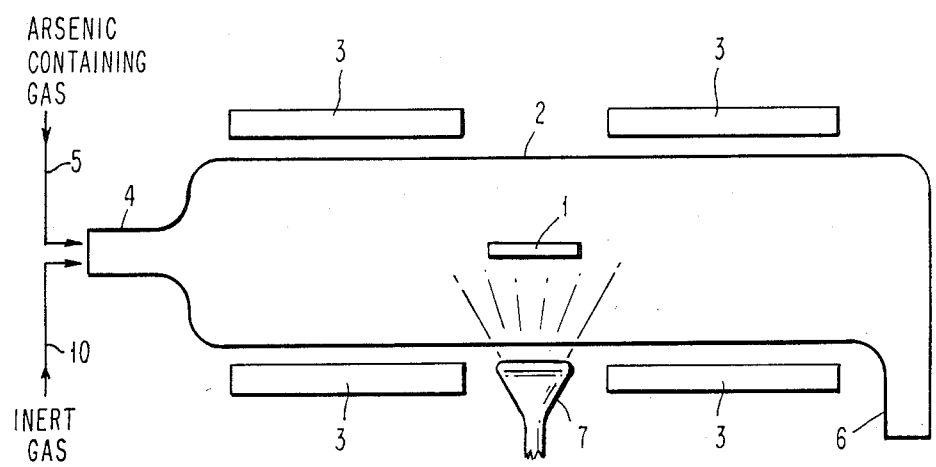

INCOHERENT LIGHT ANNEALING OF GALLIUM ARSENIDE SUBSTRATE

DESCRIPTION

1. Technical Field

The present invention is concerned with a process for annealing an ion implanted gallium arsenide substrate. In particular, the present invention is concerned with annealing in an arsenic-containing gaseous ambient to provide control of the annealing.

2. Background Art

Multiple element compound semiconductor materials have electro-optical and carrier transport properties which are useful in semiconductor devices. However, the multielement crystal responds to the effects of such processing operations as heating in ways that not only affect the location of impurities, but also the stoichiometry of the crystal. Where the crystal surface undergoing processing is a relatively broad area, such as is the case where an integrated circuit is being produced, the conditions must be uniform over the entire surface area in order to assure a yield of uniform devices.

One technique of introducing semiconductor property imparting impurities into such crystals is known as ion implantation. This technique has the advantages of precision positioning, and low, in the vicinity of room temperature, processing; but the technique also requires a subsequent annealing step at high temperatures which is necessary to repair crystal damage and to activate the implanted impurities.

With large scale integration of circuits, the surface area becomes larger and uniform ion implantation activation annealing becomes more difficult, the major reason being the possible localized loss of the volatile ingredients of the multiple element compound semiconductor material.

There have been some efforts in the art to control the problem of uniformity over a multiple element compound semiconductor surface when an ion implantation annealing step is employed.

For instance, the tendency of the multiple element compound semiconductor gallium arsenide, to decompose in processing, has received a certain degree of attention in the art. One technique suggested is to apply a capping layer such as $SiO_2$ over the gallium arsenide during the annealing to prevent decomposition. Such technique is suggested, for instance, in U.S. Pat. No. 4,226,667.

Another technique involves the use of a native oxide of the gallium arsenide as suggested in U.S. Pat. No. 3,969,164.

The art has been particularly concerned with a control of the surface stoichiometry. For instance, in U.S. Pat. No. 4,135,952 an effort is made to keep gallium arsenide from decomposing during ion implantation annealing by placing the gallium arsenide crystal surface in proximity with a gallium arsenide crystal in a gallium solution.

The desirability of having an excess of the more volatile element of the gallium arsenide is shown in U.S. Pat. No. 4,312,681 wherein InAs is used as a source of excess arsenic to prevent decomposition. The above-discussed processes each require a relatively long period of time for annealing such as about 30 minutes.

In Appl. Phys. Lett. 38, 8 Apr. 15, 1981, page 639, detrimental effects of diffusion of certain substrate impurities in the material gallium arsenide during long annealing steps is recognized and high pressure arsenic pressure from InAs is employed for control.

In Device Research Conference IVA-7-June 26-28, 1982, selective evaporation of gallium arsenide during a conventional long ion implantation annealing step and diffussion of manganese from a substrate are reported as problems.

In addition, U.S. patent application Ser. No. 440,655 to Hodgson, et al. filed Nov. 10, 1982 discloses the ion implanted impurity activation in a multiple compound semiconductor crystal such as gallium arsenide, GaAs, over a broad integrated circuit device area has been accomplished using a short time anneal in the proximity of a uniform concentration of the most volatile element of the crystal in solid form over the broad integrated circuit device area surface. A GaAs integrated circuit wafer having ion implanted impurities in the surface for an integrated circuit is annealed at temperatures of about 800° C. to about 900° C. for a time in the order of about 1 second to about 20 seconds in the proximity of a uniform layer of solid arsenic.

The solid, most volatile element becomes a uniform controlled gas source during the annealing step used to activate the ion implanted impurities permitting a short, of the order of a few seconds, conventional temperature annealing step.

In addition, U.S. patent application Ser. No. 440,654 filed Nov. 10, 1982, entitled "Intermediate Passivation and Cleaning of Compound Semiconductor Surfaces" by Freeouf, et al. discloses on arrangement for providing the solid arsenic source on a wafer of gallium arsenide by a photoetch technique. The disclosures of the above two U.S. patent applications are incorporated herein by reference.

In addition, Japanese patent publication No. 55-158628 suggests incrementally heating a gallium arsenide substrate with a laser in a stream of hot As gas. Such a suggested method suffers from various problems including inability to prevent arsenic condensation on the walls of the processing apparatus which, in turn, leads to unreliability in the control of the amount of arsenic provided to the substrate. Such as a method also suffers from the fact that laser heating of a semiconductor substrate is very non-uniform and leads to stress-related crystallographic difficulties.

SUMMARY OF INVENTION

The process of the present invention provides for improved control of the annealing process and improved uniformity of the atmosphere or ambient surrounding the substrate during the annealing process. In addition, the present invention prevents arsenic from condensing or depositing onto the walls of the processing apparatus. The present invention also prevents contamination during the annealing process, requires considerably less time than conventional furnace anneals, and heats the semiconductor wafer uniformly and without inducing stress.

The present invention is concerned with a process for annealing ion implanted gallium arsenide substrate which includes maintaining the gallium arsenide substrate on all sides above about 400° C. in an arsenic-containing gaseous ambient on all sides of the substrate. The gallium arsenide substrate is maintained at above about 400° C. by hot zones both upstream and downstream of the site of the gallium arsenide substrate. The gallium arsenide substrate is heated employing broad area incoherent light for a time sufficient for annealing the ion implanted gallium arsenide substrate.

BRIEF DESCRIPTION OF DRAWINGS

The FIGURE is a schematic diagram of apparatus suitable for carrying out the process of the present invention.

BEST AND VARIOUS MODES FOR CARRYING OUT THE INVENTION

In accordance with the present invention, an ion implanted gallium arsenide substrate is maintained in an arsenic-containing gaseous ambient. The gallium arsenide substrate can be obtained by introducing silicon ions by ion bombardment into a crystalline gallium arsenide device wafer at energies of about 50 to about 200 kiloelectron volts (KEV) at fluences of about $10^{12}$ to about $10^{14}$ ions per square meter to a depth of about 1000 angstroms to about 4000 angstroms. Other usable n-type dopants include Se, S, Te, and Sn. Examples of p-type dopants are Zn, Cd, Be, Mg, and Mn.

Referring to the FIGURE, the ion implanted gallium arsenide substrate 1 is placed in a furnace 2 such as a quartz furnace tube. The substrate 1 is placed on a holder (not shown) in the tube. Surrounding the tube both upstream and downstream of the gallium arsenide substrate are furnaces 3.

Arsenic-containing gas such as arsine is introduced into furnace tube 2 via conduit 5 and is heated to a temperature of at least about 600° C. and preferably about 600° C. to about 800° C. by the furnaces 3 upstream of substrate 1. This allows the arsine to pyrolyze into arsenic-containing species such as As, $As_2$, and $As_4$ vapors for better reaction with the gallium arsenide surface during the anneal. The arsenic-containing gas is preferably mixed with an inert gas such as hydrogen, nitrogen, or argon introduced via conduit 10. The gas mixture should contain at least about 0.01% by volume and preferably at least about 0.2% by volume of the arsenic-containing gas (e.g., arsine). Preferably the gas mixture contains about 0.2% to about 1% by volume of arsine. The arsenic-containing gas mixture in the tube is maintained at the temperature of above about 600° C. upstream, and at least above about 400° C., and preferably about 400° C. to 600° C. downstream of the substrate by the furnaces 3. Heat conduction by the quartz tube and convection by the hot gases maintain the portion of the tube surrounding the GaAs substrate above the condensation temperature of As, about 400° C., so that no As condenses anywhere in the heated portion of the tube 2. However, it is important that the temperature of the gallium arsenide not be in excess of about 750° C. so as to prevent activation of the implanted ions in the substrate before the annealing. The arsenic-containing gas is conveyed over and around the gallium arsenide substrate and is removed from the quartz furnace tube 2 via conduit 6. If desired, the gas can be recycled back to the furnace tube 2 via tube inlet 4.

The gallium arsenide substrate is annealed at temperatures of about 900° C. to about 1100° C. by light from light source 7. Light source 7 is a broad area incoherent light capable of heating the entire substrate to a uniform temperature simultaneously. The light provides a beam of uniform illumination or intensity onto the substrate. Suitable light sources include arc lamps such as carbon or argon arc lamps. Other suitable lamps include quartz halogen lamps and lamps with tungsten bulbs. The intensity of the light is usually about 20 watts/square centimeter to about 200 watts/square centimeter and preferably about 50 to about 100 watts/square centimeter of substrate.

This anneal takes place in about 1 to about 20 seconds, preferably about 1 to about 5 seconds, and most preferably 1 to 2 seconds. The substrate, during the annealing, reaches a temperature between about 900° C. to about 1100° C. Normally at such high temperatures a great deal of As would be lost during the processing, thereby destroying the implanted region. The As-containing gases present during the high temperature periods prevent this As loss.

The above-procedure provides a controlled uniform arsenic pressure during the annealing and eliminates possible contamination and stress difficulties from previously described annealing processes.

The following non-limiting example is presented to further illustrate the present invention:

EXAMPLE

A high-resistance GaAs wafer of at least $10^6$ ohm cm is implanted with $Si^{28}$ ions at 150 kiloelectron volts at a dose of $3 \times 10^{12}$ ions per square centimeter. The wafer is placed on a quartz holder located inside a quartz tube with a clear zone 4 inches long surrounded by furnaces on each side. A gas mixture of about 0.2% arsine ($AsH_3$), about 20% hydrogen, and about 79.8% argon by volume is introduced into the tube at a total flow rate of about 1.8 liters per minute at atmospheric pressure. The furnace upstream is heated to about 650° C. and the furnace downstream to about 500° C. After about 30 minutes, in which time the gases and temperatures are permitted to equilibrate, the light from a 1000 watt quartz-halogen lamp is directed onto the GaAs wafer to result in a power density of about 100 watts per square centimeter. The light source is kept on for a total of about 8 seconds, thereby heating the GaAs wafer up to about 1000° C. within the first 6 seconds and maintaining it at 1000° C. for the final 2 seconds. The light is then switched off, the furnaces are switched off, and the gas is changed to pure argon at about 1 liter per minute flow rate. After about 15 minutes of gas flushing of the tube, the sample is removed from the apparatus.

What is claimed is:

1. A process for annealing an ion implanted gallium arsenide substrate which comprises maintaining said gallium arsenide substrate on all sides above about 400° C. in an arsenic-containing gaseous ambient on all sides of said substrate;

heating said gallium arsenide substrate with broad area incoherent light for a time sufficient for annealing said ion implanted gallium arsenide substrate.

2. The process of claim 1 wherein said substrate contains silicon ions introduced at energies of about 50 to about 200 kiloelectron volts at fluences of about $10^{12}$ to about $10^{14}$ ions per square meter to a depth of about 1000 angstroms to about 4000 angstroms.

3. The process of claim 1 wherein said arsenic-containing gaseous ambient is from arsine.

4. The process of claim 1 wherein the gallium arsenide substrate is heated to a temperature of about 900° C. to about 1100° C. with said light.

5. The process of claim 1 wherein the intensity of the light is about 20 watts/square centimeter to about 200 watts/square centimeter of substrate.

6. The process of claim 1 wherein the intensity of said light is about 50 to about 100 watts/square centimeter of said substrate.

7. The process of claim 1 wherein the time for the annealing is about 1 to about 20 seconds.

8. The process of claim 1 wherein the time for annealing is about 1 to about 5 seconds.

9. The process of claim 1 wherein the time for annealing is about 1 to about 2 seconds.

10. The process of claim 1 wherein the gallium arsenide substrate is heated to a temperature of about 900° C. to about 1100° C. for a time of about 1 to about 20 seconds and wherein said arsenic-containing gaseous ambient is obtained from arsine.

11. The process of claim 10 wherein the time for annealing is about 1 to about 5 seconds.

12. The process of claim 10 wherein the time for annealing is about 1 to about 2 seconds.

13. The process of claim 1 wherein said arsenic-containing gaseous ambient includes an inert gas.

14. The process of claim 1 wherein said ambient is about 600° C. to about 800° C.

15. The process of claim 1 wherein said arsenic-containing gaseous ambient downstream of said substrate is at least above about 400° C. and wherein said arsenic-containing gaseous ambient upstream of said substrate is above about 600° C.

16. The process of claim 1 wherein said arsenic-containing gaseous ambient downstream of said substrate is about 400° C. to 600° C.

17. The process of claim 1 wherein the temperature of said gallium arsenide substrate is not in excess of about 750° C. prior to the annealing.

18. The process of claim 13 wherein said inert gas is hydrogen, nitrogen, or argon or mixtures thereof.

19. The process of claim 16 wherein the temperature of said gallium arsenide substrate is not in excess of about 750° C. prior to the annealing.

* * * * *